United States Patent [19]

Mackintosh et al.

[11] 4,118,197
[45] Oct. 3, 1978

[54] CARTRIDGE AND FURNACE FOR CRYSTAL GROWTH

[75] Inventors: Brian H. Mackintosh, West Roxbury; David N. Jewett, Harvard, both of Mass.

[73] Assignee: Mobil Tyco Solar Energy Corp., Waltham, Mass.

[21] Appl. No.: 761,941

[22] Filed: Jan. 24, 1977

[51] Int. Cl.² .............................................. B01J 17/18
[52] U.S. Cl. ................................. 422/246; 156/608; 156/617 SP; 156/DIG. 98; 422/249
[58] Field of Search ......... 156/608, 617 SP, DIG. 98; 23/273 Z, 273 SP

[56] References Cited

U.S. PATENT DOCUMENTS

| 2,927,008 | 3/1960 | Shockley | 156/608 |
|---|---|---|---|
| 3,124,489 | 3/1964 | Vogel, Jr. | 156/608 |
| 3,244,486 | 4/1966 | Bennett | 156/608 |
| 3,265,469 | 8/1966 | Hall | 156/608 |
| 3,291,571 | 12/1966 | Dohmen | 156/608 |
| 3,650,703 | 3/1972 | Labelle, Jr. | 156/608 |
| 3,961,905 | 6/1976 | Rice | 156/608 |
| 3,994,690 | 11/1976 | Defosse | 156/620 |

FOREIGN PATENT DOCUMENTS

| A1,235,174 | 9/1962 | France | 156/608 |
|---|---|---|---|
| 1,769,481 | 1/1973 | Fed. Rep. of Germany | 156/608 |

*Primary Examiner*—Stephen J. Emery
*Attorney, Agent, or Firm*—Schiller & Pandiscio

[57] ABSTRACT

A novel cartridge containing selected crystal growth components is provided for use in a crystal growing system. The cartridge is adapted to be mounted directly to a crystal pulling mechanism and is arranged so that it can be inserted into a furnace containing a supply of molten feed material. The cartridge includes a crystal growing die, a die holder, and associated crystal growth components arranged to permit rapid growth of selected shape. The cartridge is assembled outside of the furnace at room temperature and can be inserted into and removed from the furnace without having to cool the latter.

28 Claims, 13 Drawing Figures

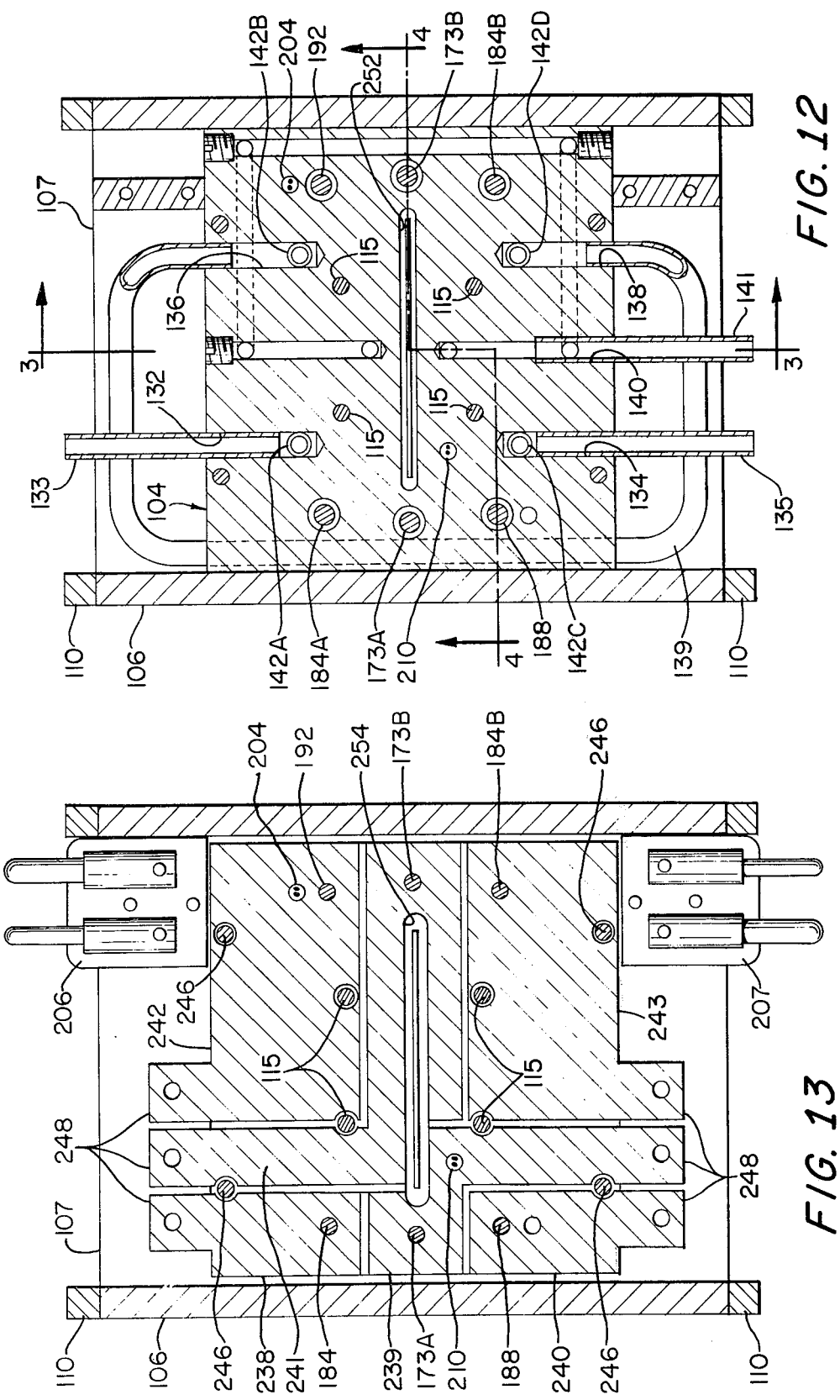

CARTRIDGE AND FURNACE FOR CRYSTAL GROWTH

This invention relates to the art of growing crystals and more particularly to improved apparatus for growing elongate crystalline bodies from a melt.

A number of different processes are known for growing crystalline bodies from a melt. Two prior art processes which are known to persons skilled in the art are described by U.S. Pat. Nos. 3,591,348 and 3,471,366. The first mentioned patent describes how to grow crystalline bodies according to what is called the edge-defined, film-fed growth technique (also commonly referred to as the EFG process). In the EFG process the shape of the crystalline body which is grown is determined by the external or edge configuration of the end surface of a forming member which, for want of a better name, is called a die. The process involves growth on a seed from melt which is located between the growing body and the end surface of the die, with the melt being continuously replenished from a suitable melt reservoir via one or more capillaries in the die. The growing body grows to the shape of the edge configuration of the top end of the die.

U.S. Pat. No. 3,471,266 discloses a related process which employs a forming member that includes a capillary for containing a supply of melt from which a crystal body is grown and pulled. Depending upon the cross-sectional configuration of the capillary and by appropriately controlling the thermal conditions in the upper end of the capillary, it is possible to grow crystal bodies of selected cross-sectional shapes.

Both of the foregoing processes are useful in growing material such as alumina and silicon in various shapes, including cylindrical tubes and thin flat ribbons.

The growth of crystals by both of the above described methods usually involves the use of die holders, heat shields, after heaters, and guides in addition to the dies. Such components are precisely made and must be accurately positioned with respect to each other above a crucible of molten feed material, i.e., the melt, so that the feed material will be drawn into the die by capillary flow and will be converted by solidification to a substantially monocrystalline body of preselected cross-sectional configuration. Typically these growth components are assembled and installed in the furnace in proper relation to the crucible while the furnace is in cold condition. In the event that any of these components becomes defective, it is necessary not only to terminate the crystal growth but also to cool the furnace to room temperature before the defective part can be replaced. Cooling the furnace to room temperature takes a number of hours, and usually the replacement of a defective component involves disassembly and reassembly of the other adjacent components as well as component realignment procedures. It also is known that the problem of growing unstrained crystals at relatively high rates involves (1) a very steep gradient at the crystal growth interface in order to remove the latent heat of fusion and produce rapid crystal growth and (2) a linear reduction in temperature along the crystal from close to the melting point to a suitably low temperature to relieve thermal stresses in the crystal.

Accordingly, the primary object of this invention is to provide an improved apparatus for growing crystalline bodies using capillary dies as above described, wherein the apparatus is characterized by a discrete cartridge which comprises a plurality of crystal growth components consisting of a die, die holder, and any associated heat shield(s), heater(s), and other critical element(s) arranged as a unitary structure which can be inserted into a furnace while the latter is at operating temperature and can also be removed without first having to cool the furnace down to room temperature. An ancillary object and advantage of the invention is provision of a furnace which is arranged so as to permit rapid replacement of individual defective crystal growth components or rapid replacement of one crystal growth system with another crystal growth system.

Another important object is to provide a cartridge of the character described which contains at least one of the following components: (a) means for producing a steep thermal gradient at the growth interface only and (b) means for providing a substantially uniform thermal gradient along a predetermined length of the grown crystal to prevent and relax stresses in the crystal.

A further object of the invention is to provide apparatus for growing several crystals from a single melt crucible which is adapted to permit the temperature and other growth parameters of the crystals to be adjusted individually and also to permit the crystal growth components involved in growing one particular crystal to be replaced without having to cool down the entire furnace or otherwise disturbing the environment or growth conditions of the other crystals which are being grown.

A further object of the invention is to provide a crystal growing furnace with two or more individually removable cartridges of the character described where the cartridges include like or different dies, whereby a plurality of like or different shaped crystalline bodies can be grown simultaneously.

The foregoing and other objects of this invention are achieved by providing a crystal growing apparatus comprising a furnace enclosure adapted to contain and heat a supply of a selected feed material, and at least one assembly consisting of a cartridge of preselected crystal growth components and a pulling mechanism attached to and supporting the cartridge, with the assembly being disposed so that the cartridge can be moved into and out of the furnace enclosure.

Other objects and many of the attendant advantages of this invention are set forth in or rendered obvious by the following detailed specification which is to be considered together with the accompanying drawings wherein.

Figures 4, 5:
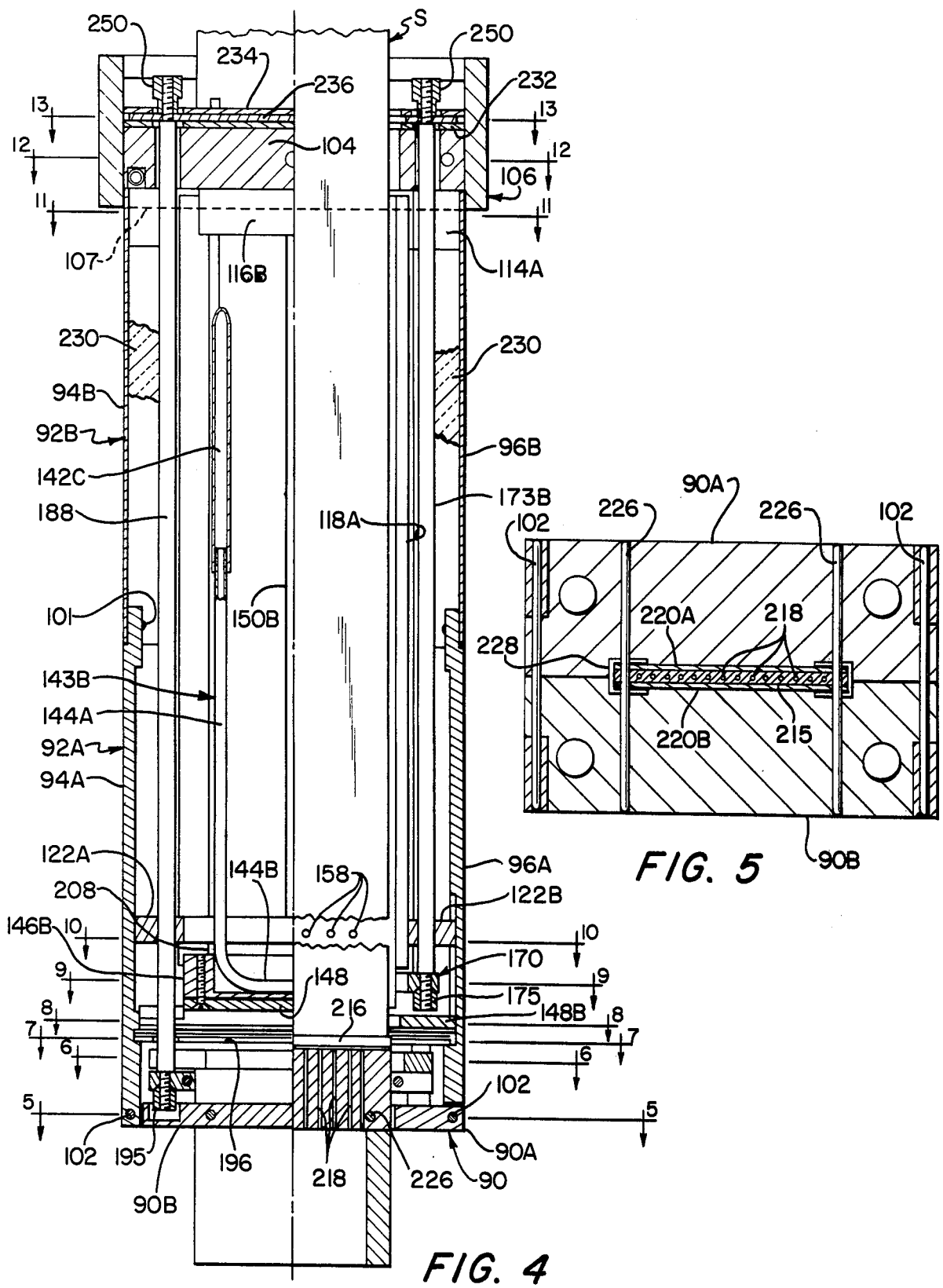
FIG. 4 is a longitudinal sectional view of the cartridge taken along line 4—4 of FIG. 12.
FIGS. 5-7 are cross-sectional views of the cartridge taken along lines 5—5, 6—6 and 7—7 respectively of FIG. 4.
Figure 8:
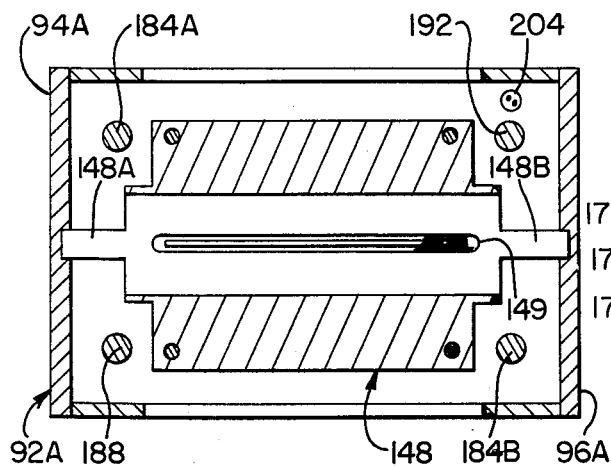
Figure 9:
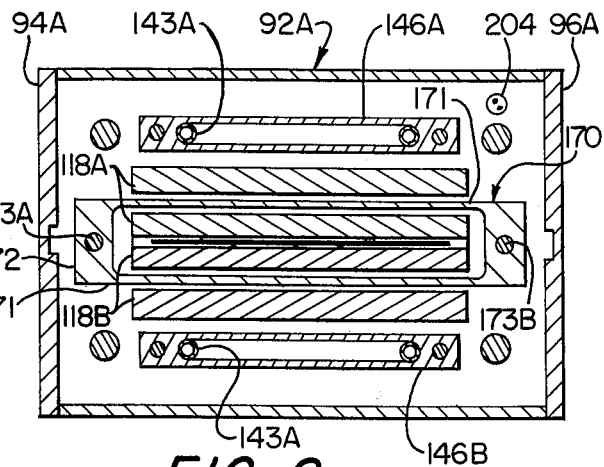
Figure 10:
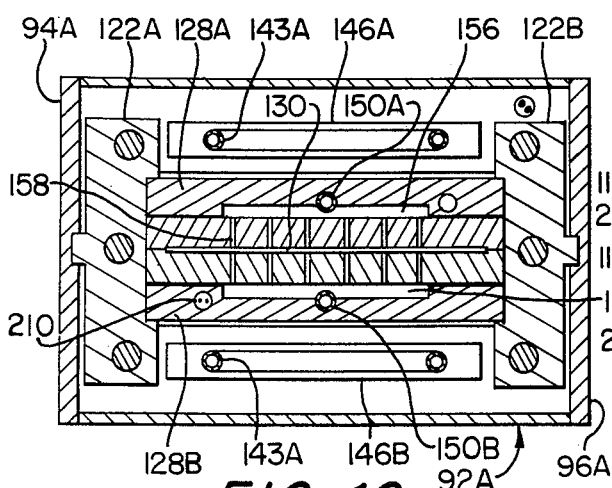
Figure 11:
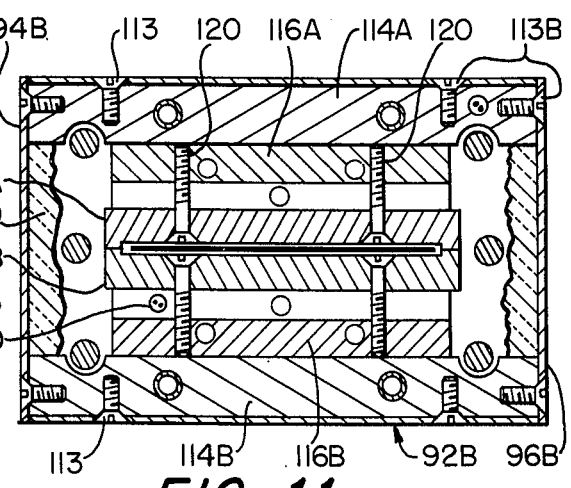

FIGS. 8-10 are cross-sectional views of the cartridge taken along lines 8—8, 9—9 and 10—10 respectively of FIG. 4; and FIGS. 11-13 are cross-sectional views of the cartridge taken along lines 11—11, 12—12 and 13—13 of FIG. 4.

Although the illustrated embodiment of the cartridge hereinafter described is arranged for growing flat ribbons of silicon, it is to be understood that the cartridge may be arranged for use in growing crystalline bodies of another material and/or another cross-sectional shape. By way of example, the invention may be adapted to grow crystalline bodies of alumina or to grow crystalline bodies of tubular cross-section or in the shape of solid rods. Furthermore, it is contemplated that the furnace may be arranged so as to employ RF heating in place of electrical resistance heaters for heating the feed material and the crucible in which it is contained. Obviously the choice of material used to form the crucible and also crystal growth components of the cartridges will depend upon the composition of the melt. Thus, for example, if the melt is alumina, the crucible, die, die holder and heat shields would preferably be made of molybdenum or tungsten, while for silicon the crucible and die holder would preferably be made of the materials hereinafter described.

As used in the foregoing specification and claims, the terms "capillary die member" and "capillary die assembly" are intended to denote and should be interpreted as covering capillary dies designed to operate and to be used in the manner described in said U.S. Pat. Nos. 3,591,348 and 3,471,366, and as further described in 3,870,477. The term "growth interface" is intended to denote and is to be construed as meaning the solid-liquid interface between the melt which is supplied by the capillary die and the crystalline body which is pulled from the melt which is supplied by the capillary die.

Figure 1:
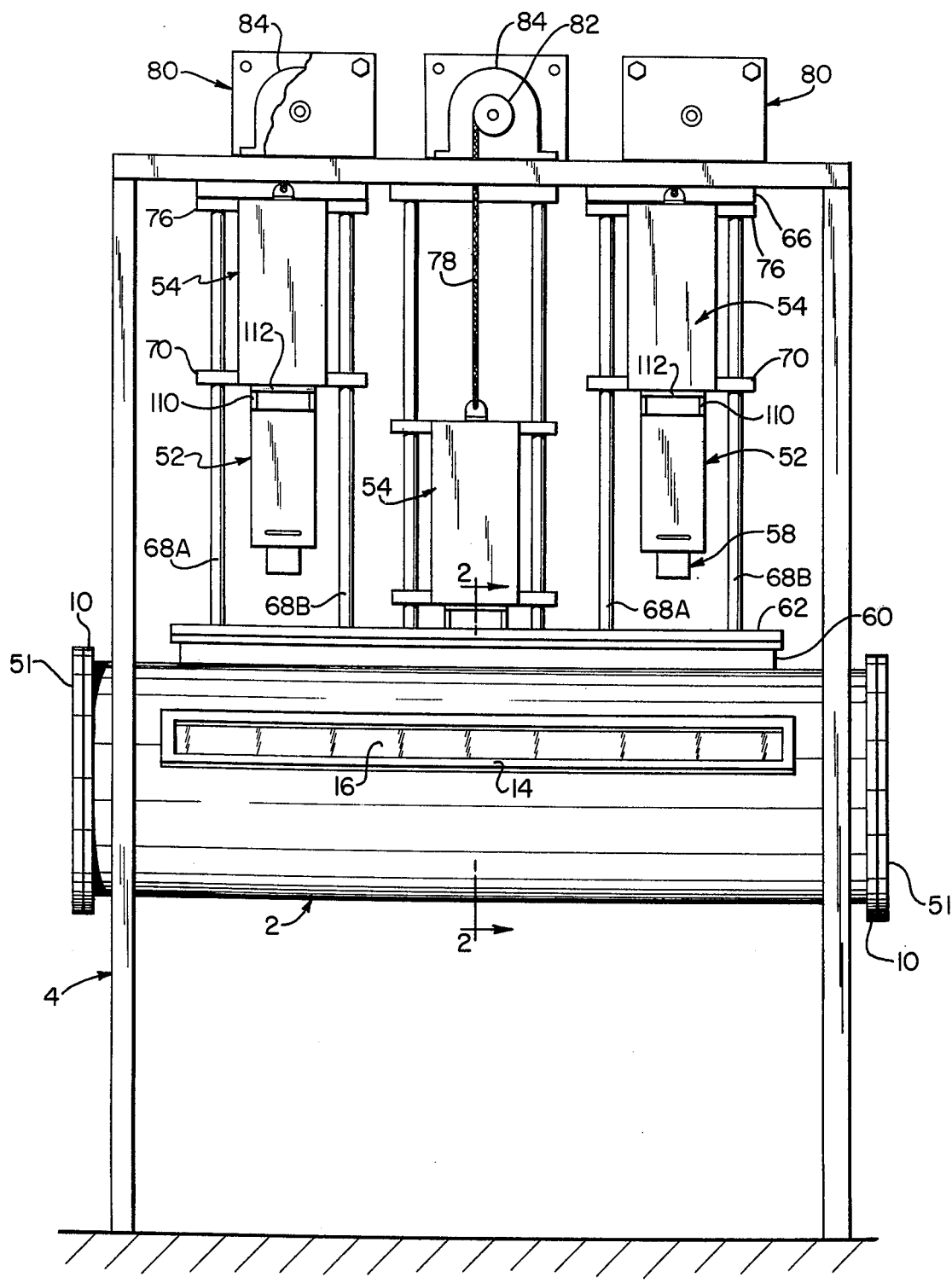
FIG. 1 is a side elevation of apparatus comprising a furnace, a plurality of pulling mechanisms, and a plurality of crystal growth component cartridges constructed and arranged in accordance with the present invention.
Figure 2:
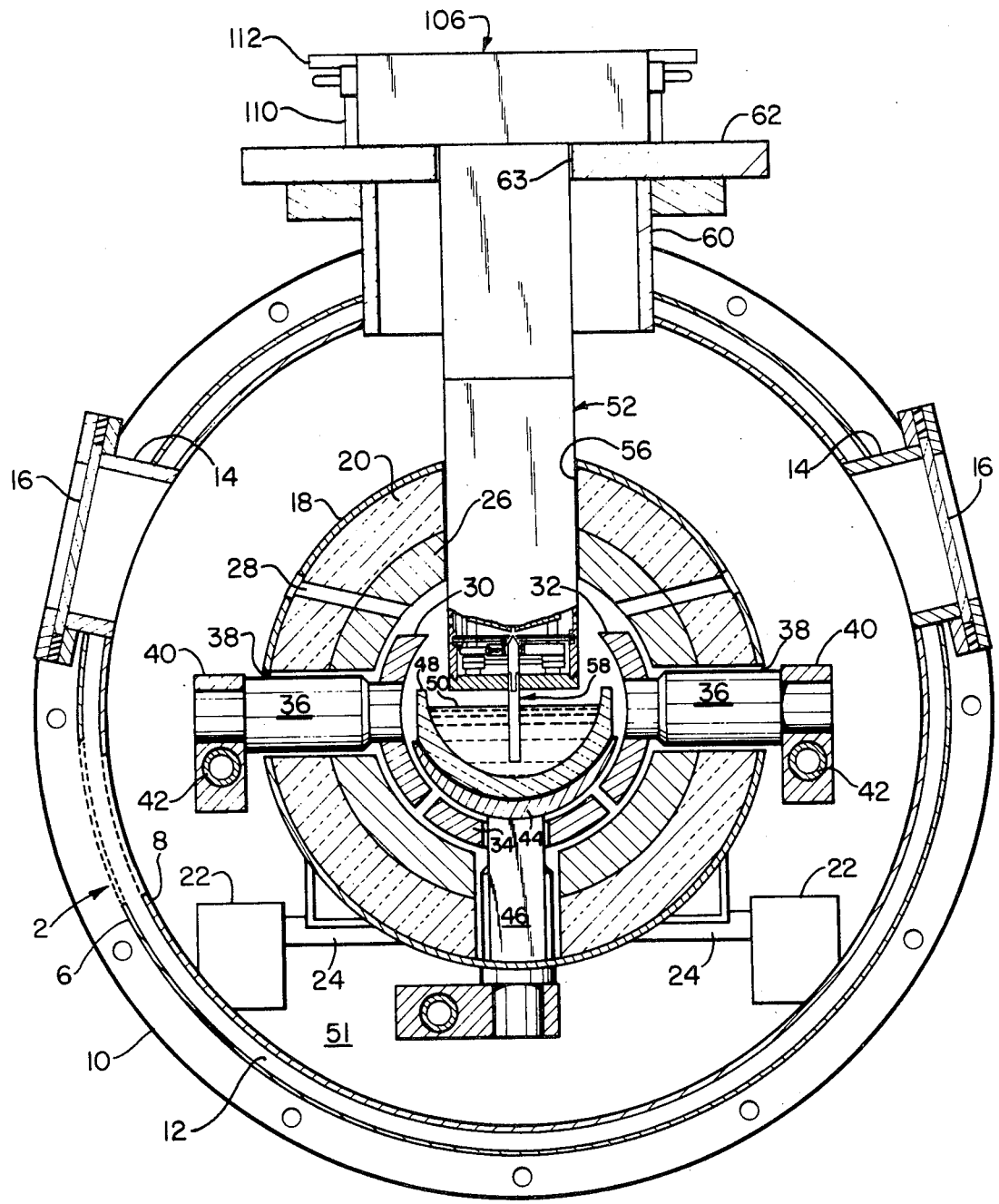
FIG. 2 is a cross-sectional view on an enlarged scale of the furnace mechanism, plus a portion of one cartridge.

Turning now to FIGS. 1 and 2, there is shown an apparatus which comprises a furnace in the form of a horizontal enclosure 2 supported on a frame 4 and comprising a double wall outer shell consisting of concentric steel cylinders 6 and 8 which cooperate with annular end walls 10 to form a water jacket having a space 12 through which water is circulated. The furnace includes at least one and preferably two sight ports 14 which are fitted with hermetically sealed windows 16. Disposed within the outer shell of the furnace is an inner shell 18 which is made of steel and is lined on its inside with a relatively stiff liner made of a suitable insulating material 20 such as fibrous graphite. The inner shell 18 is supported concentrically of the outer shell by means of a support assembly at each end. Each support assembly may consist of a pair of first support members 22 which are attached to the inner cylinder 8 of the outer shell and a pair of horizontally extending second support members 24 which are attached to the first support members and also to the inner shell 18.

The inner surface of liner 20 is covered by a second insulating liner 26 which preferably consists of a plurality of leyers of sheet graphite (as described in U.S. Pat. No. 3,404,061) that are cemented in place. The inner shell 18 and its liners 20 and 26 are formed with aligned openings which cooperate to form a sight passageway 28 aligned with each sight port 14. Disposed within the liner 26 are three elongate electrical resistance graphite heaters 30, 32 and 34 of arcuate cross-section. Heaters 32-36 are elongate lengthwise of the furnace and each end of each heater is attached to a separate electrically conductive heater support rod 36 which extends through a passageway 38 formed by aligned openings in the inner shell 18 and its liners 20 and 26. Each heater support rod 36 is attached at its outer end to a separate electrically conductive terminal bar 40. Each terminal bar 40 in turn is attached to a separate hollow electrical conductor. The two terminal bars 40 associated with each heater are connected by the associated pair of hollow conductors 42 to a source of electric power (not shown) located externally of the furnace enclosure. The conductors 42 are made hollow so that water may be circulated through them for cooling purposes. The conductors which are used to connect the heaters to their electrical power supply are not shown since such means are not part of the present invention and since they may be made in various ways as is obvious to persons skilled in the art.

Disposed within the space encompassed by heaters 30-34 is graphite crucible holder 44 which is elongated lengthwise of the furnace and has an arcuate cross-section. Holder 44 is supported at several points by individual support bars 46 which extend through suitable openings formed in liners 20 and 26 and are attached to the inner surface of the inner shell 18. The trough-shaped holder 44 supports an elongate quartz (or graphite) crucible 48 which also preferably has a trough-shaped cross-section. In essence crucible 48 is what is commonly termed a "boat". Crucible 48 is used to contain the feed material which by appropriate operation of the heaters is converted to a melt as shown at 50. Each end of the furnace is closed off by a circular cover plate 51 which is bolted to the corresponding end wall 10.

Operatively associated with the furnace are several cartridges identified generally at 52 and preferably, but not necessarily, each cartridge is attached to and supported by a separate pulling mechanism 54, with the latter preferably being arranged to be raised and lowered in the manner hereinafter described.

As will be described hereinafter in greater detail, each cartridge contains a capillary die, plus several associated crystal growth components. The cartridges are elongate and designed for insertion into inner shell 18 of the furnace. Thus for each cartridge, inner shell 18 and its liners 20 and 26 are formed with aligned openings at the 12 o'clock position, whereby to provide an access way 56 (FIG. 2) through which the cartridge may be inserted into operating position. Each access way 56 is sized so as to make a close fit with the associated cartridge 52.

As seen in FIG. 2, the bottom end of each cartridge includes and supports an EFG die generally identified by the numeral 58 which is designed for growing a silicon ribbon. When the cartridge is properly disposed in its intended operating position with respect to the furnace, the lower end of the EFG die will be submerged in the melt 50 as shown in FIG. 2.

Preferably but not necessarily, the outer shell of the furnace is provided with a single elongate access opening formed by a port 60 through which the several cartridges 52 may be introduced into the furnace enclosure and disposed in the position shown in FIG. 2. Access port 60 is provided with a horizontal flange 62 which serves as a stop for the cartridge when it is inserted into the furnace. Flange 62 defines a number of openings 63 which are aligned with the several access ways 56. Openings 63 are appropriate in size and number to allow the several cartridges to be inserted into and withdrawn from the furnace.

Each cartridge 52 is attached to a separate crystal puller assembly 54 which is supported by and can be reciprocated vertically relative to a support 66 which is attached to frame 4. Each support 66 comprises a pair of vertical slide rods 68A and 68B which serve to guide and slidably support a puller. The bottom ends of slide rods 68 are anchored to the flange 62 on the upper end of furnace port 60. A detailed description of the construction of the pullers 54 is omitted since various forms of crystal pullers may be used in practicing this invention. However, preferably, they are of the type employing a pair of mutually confronting endless belts to grip and transport the growing crystal and are constructed in accordance with the teachings of U.S. Pat. No. 3,607,112 issued Sept. 21, 1971 to Seymour Mermelstein for Endless Belt Seed Crystal Gripping and Pulling Means. To the extent required, the apparatus shown in said U.S. Pat. No. 3,607,112 is incorporated herein by reference. In the case of the illustrated embodiment each puller assembly includes a bottom plate 70 to which is attached the cartridge assembly 52 and an upper plate 76 which is attached by means of a cable 78 to a winch 80 that is supported on frame 4. Plates 70 and 76 have aligned holes for slidably receiving rods 68A and 68B. The capstan 82 of each winch is driven by a reversible motor 84 and acts on cable 78 to raise or lower the associated belt puller and cartridge assembly. Support 66 is located so that the winches can fully withdraw the cartridges from the furnace and preferably elevate them so that the bottom ends of the dies 58 are located at least five or six inches above flange 62. This allows each cartridge 52 to be fully accessible for maintainance and repair. It is to be appreciated also that each cartridge is removably secured to its puller assembly by bolts and nuts or screws, so that an entire cartridge unit can be removed and replaced by another like or different unit.

Figure 3:
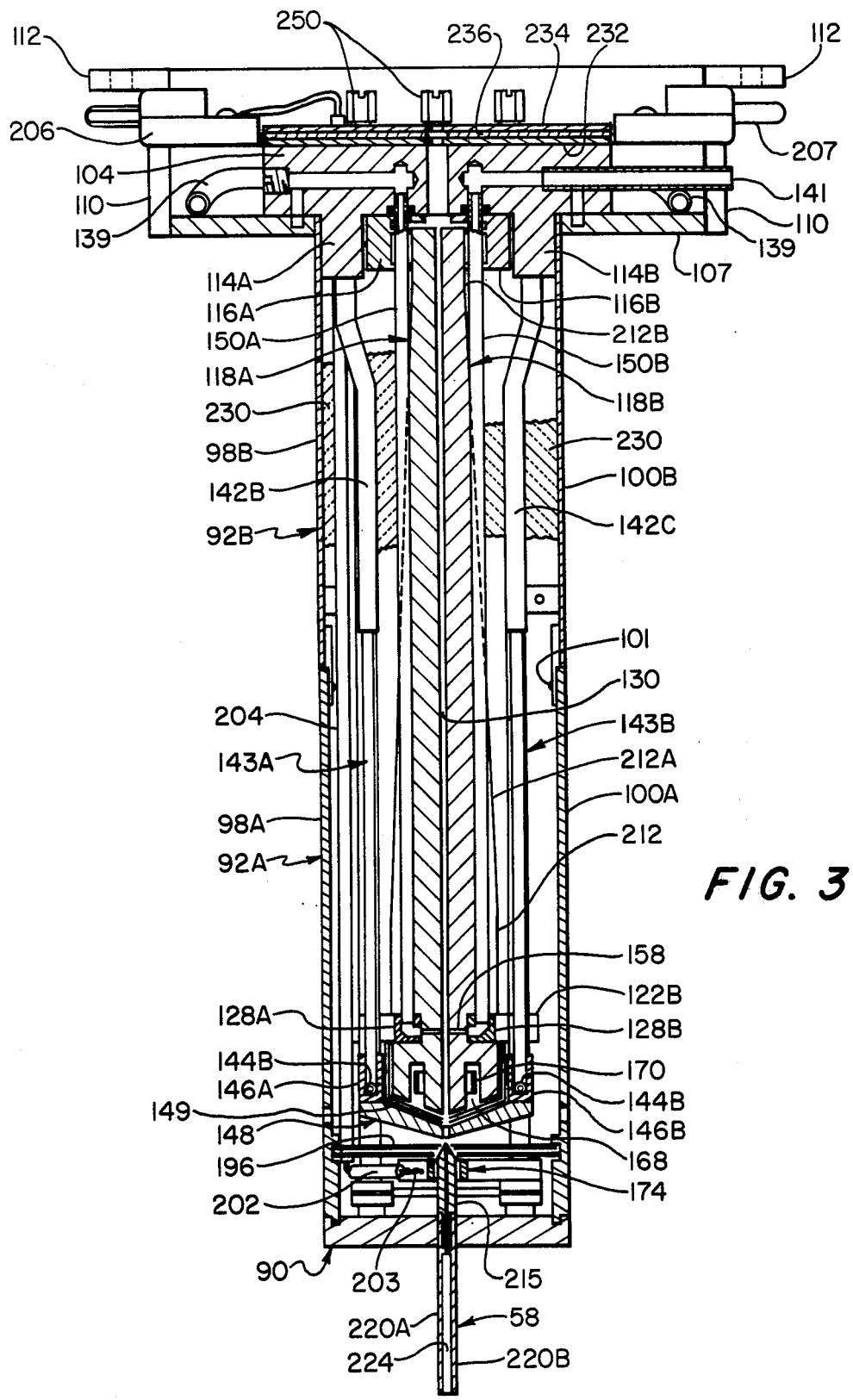
FIG. 3 is a longitudinal sectional view on an enlarged scale of the cartridge of FIG. 2, taken along line 3—3 of FIG. 12.

Referring now to FIGS. 3-12, in the preferred embodiment of the invention each cartridge essentially comprises a capillary die 58, a die holder, a cooling means for establishing a relatively steep temperature gradient immediately above the die so as to increase the growth rate, and a heat conductive structure for cooling the crystal according to a relatively shallow, carefully controlled temperature gradient to reduce stresses, plus other related components, all of which are assembled so as to form a unitary structure which can be installed in a furnace in cold condition. As seen best in FIGS. 3-5, the cartridge consists of a graphite bottom wall identified generally by numeral 90 which is affixed to a hollow lower housing 92A of rectangular cross-section. Housing 92 is made of graphite plates and comprises relatively narrow side walls 94A and 96A and relatively wide side walls 98A and 100A. Bottom wall 90 actually consists of two graphite plates 90A and 90B which extend into slots formed in walls 94A and 96A and are locked thereto by graphite pins 102, while the bottom ends of walls 98A and 100A form a tongue and groove connection with the same bottom wall plates as shown in FIG. 3. The upper end of lower housing 92 is releasably connected by screws 101 to a hollow upper housing section 92B which consists of walls 94B, 96B, 98B and 100B made of stainless steel. The upper ends of these walls are attached to a header assembly which is described in greater detail hereinafter.

As seen in FIGS. 3, 4, 11 and 12, each header assembly comprises a metal header block 104 which is affixed to a U-shaped channel member 106. The bight or web section 107 of channel 106 is provided with a rectangular opening through which extend the upper housing section walls 94B-100B. Affixed to each end of channel section 106 is a bracket 110 having a flange 112 which is releasably secured by suitable screws (not shown) to the bottom plate 70 of the associated crystal puller. As seen in FIG. 3, header block 104 is provided with two like mutually spaced depending sections 114A and 114B which are referred to hereinafter as mounting blocks. Screws 113 are used to secure the upper ends of walls 94B-100B to mounting blocks 114 whereby the header assembly is secured to upper housing section 92B. It is to be noted that channel member 106 projects laterally beyond the relatively wide side walls 98B and 100B of upper housing section 92B, and thus is disposed to be intercepted by flange 62 of access port 60 when the cartridge is lowered into the furnace. By appropriately setting the length of the cartridge, channel member 106 and flange 62 will cooperate to function as a stop means to halt the descent of the cartridge when the bottom end of die 58 is close to but short of the bottom of the crucible as shown in FIG. 2.

Affixed to the underside of header block 104 by means of four screws 115 (FIGS. 11-13) are two mutually spaced elongate support blocks 116A and B (FIGS. 3 and 11) which are spaced from one another so as to accommodate the upper ends of two heat-conductive graphite plates 118A and 118B of identical shape. As described in greater detail hereinafter, plates 118A and B form part of a structure which not only promotes cooling of the crystal but also provides a controlled temperature gradient along the pulling axis so as to prevent and reduce thermal stress in the final product. The upper ends of plates 118A and B are affixed to support blocks 116 by screws 120. Disposed within housing section 92A and engaged by its narrow side walls 94A and 96A are two identical locater plates 122 which are formed with ribs 127 that fit in guide slots formed in the wall members 94A and 96A. Locater plates 122 are notched at their confronting surfaces to accommodate the two heat-conductive plates 118A and 118B and also two graphite gas feed insert plates 128A and 128B. The latter are positioned in mating notches provided in plates 118A and B and coact with locater plates 122 to hold the bottom ends of the same plates tight against one another and also fixed with respect to the remaining components of the cartridge. In this connection it is to be noted that the inner faces of plates 118A and B are formed with corresponding flat recesses which are relatively shallow but are sufficient to provide a narrow passageway 130 for the flat ribbon which is to be grown.

Referring now to FIGS. 3, 4 and 9-13, header block 104 is provided with five ports 132, 134, 136, 138 and 140. Ports 132 and 134 are water inlet and outlet ports respectively which are connected to a source of cooling water (not shown) by pipes 133 and 135 respectively and a pump (not shown). Port 132 communicates through an interior passageway in header block 104 with a metal pipe 142A which is secured in and depends from mounting block 114A. Another metal pipe 142B (FIG. 12) is secured in and depends from the same mounting block 114A and communicates through an interior passageway in header block 104 with port 136. Port 134 communicates through an interior passageway in header block 104 with a metal pipe 142C which is secured in and depends from the other mounting block 114B. Still another metal pipe 142D (FIG. 12) is secured in and depends from mounting block 114B and communicates through an interior passageway in header block 104 with port 138. Attached to and extending between ports 136 and 138 is a connection pipe 139. Attached to and depending from pipes 142C and D is a U-shaped metal pipe generally identified as 143B which comprises a pair of parallel vertically-extending sections 144A (FIG. 4) connected at their lower ends by a transverse section 144B. A second like U-shaped pipe 143A is attached to and depends from pipes 142A and B. The lower transverse sections 144B of U-shaped pipes 143A and B are disposed within cavities formed in two like molybdenum cooling shoes 146A and B. These shoes are affixed to pipes 143A and B so that effectively the shoes are carried by those pipes. Shoes 146A and B are disposed adjacent the lower ends of plates 118A and B and are attached to opposite sides of a cooling plate 148 which is V-shaped in one plane (FIG. 3) and has an elongate center hole 149 through which the growing crystal can be pulled. The ends of plate 148 are formed with tongues 148A and B which fit into guide grooves formed in housing walls 94B and 96A. Cooling plate 148 is made of metal and extends beneath plates 118A and B immediately above the upper end of the capillary die. A plurality of radiating shields 149 are dispersed between cooling plate 148 and plates 118A and B to reduce heat loss from the latter to the former. Cooling plate 148 may take various shapes, but preferably it is tapered on opposite sides of hole 149 as shown in FIG. 3. Based upon the foregoing description, it is seen that a cooling fluid circuit is provided in which cooling water fed into the cartridge via pipe 133 will flow in turn through pipes 142A, 143A, 139 and 143B and exit via pipe 135, whereby heat is removed from cooling shoes 146A and 146B and cooling plate 148.

Means for feeding a cooling gas also are provided. Such means comprise a pair of relatively small diameter pipes 150A and 150B which are secured to and depend from support blocks 116A and 116B respectively. Pipe 150B communicates through an interior passageway in header block 104 and support blocks 116A and B with port 140. Pipe 150A connects with a passageway 152 in header block 104. Passageway 152 connects through additional interior passageways 153, 154 and 155 with port 140. The latter is connected to a source of cooling gas via a pipe 141. The lower ends of pipes 150A and 150B are secured in holes formed in gas feed insert plates 128A and 128B. Each plate 128A and B is notched so that each plate and the adjacent cooling plate 118 (A or B) forms a manifold chamber 156. Each of the cooling plates 118A and B is provided with a plurality of small openings 158 that communicate with manifold chambers 156, whereby gas introduced via pipes 150A and B will pass from manifold chamber 156 into the elongate space 130 formed between cooling plates 118A and B. Although not shown, it is to be understood that conduit 141 is connected to a suitable source of a cooling gas having a predetermined thermal conductivity. Preferably the gas is helium or argon and it is introduced to inlet pipe 141 under a slight positive pressure and at a rate just high enough to maintain a gas environment between cooling plates 118A and B.

Still referring to FIGS. 3 and 9, the lower ends of plates 118A and B are notched to form two elongate parallel recesses 168 to accommodate side portions of an electrical resistance afterheater 170 made of graphite. As seen in FIG. 9, afterheater 170 is in the form of a generally rectangular bar having a rectangular aperture, with the resulting side sections 171 extending along recesses 168 and the resulting end sections 172 extending alongside of the opposite edge surfaces of plates 118A and 118B. Afterheater 170 is affixed to and supported by a pair of electrical current feed bars 173A and B (FIGS. 9 and 11-13) which pass through holes in header block 104.

Referring now to FIGS. 3-6, the cartridge also includes a die face heater 174 and a pair of die end heaters 176 and 178. Face heater 174 is made of an electrically conductive material and comprises a pair of parallel face heating sections 180A and B and a pair of terminal sections 182A and B. The latter are affixed to a pair of electrical current feed bars 184A and B respectively. End heater 176 is mounted in two conductive blocks 186A and B which are secured to current feed bar 184A and an electrical current feed bar 188 respectively. End heater 178 is mounted in two conductive blocks 190A and B which are secured respectively to an electrical current feed bar 192 and feed bar 184B. Heaters 174, 176 and 178 are made of graphite and are disposed so as to heat the sides and ends of the upper end of die 58.

As seen in FIGS. 5-13, the upper ends of the six current feed bars 173A and B, 184A and B, 188 and 192 extend through header block 104. They also extend down through locater plates 122 which are made of electrical insulating material. The lower ends of circuit feed bars 173A and B terminate at and support heater element 170. For this purpose and as shown in FIG. 4, each feed bar has a reduced diameter end section which extends through an end section 174 of the heater element and is threaded to receive a nut 175 which locks it to the heater element. Still referring to FIGS. 4-6, the lower ends of feed bars 184A and B, 188 and 192 also are threaded to receive nuts 195 which serve to lock blocks 186A and B and 190A and B onto the bars. These same feed bars also pass through a plurality of mutually spaced flat plates 196 which form a multi-layer radiation shield. Plates 196 rest on shoulders formed in side walls 94A and 96A of the lower section of the cartridge housing. Plates 196 all have elongate slots through which extends the upper end of die 58. Plates 196 are located so that the uppermost one is flush with or slightly below the upper end surface of the die.

Referring now to FIGS. 3 and 7-10, a thermocouple is provided for measuring the temperature adjacent to the upper end of die 58. The thermocouple bead 203 is supported close to the die by a ceramic tube 202, while the wire leads of the thermocouple are fixed in a ceramic tube 204 which is anchored in a passageway in header block 104. The upper ends of the thermocouple leads are brought out through the upper end of header block 104 and connected to terminals on a plug connector 206 which is affixed to the header block. A second plug connector 207 is provided for connection to a second thermocouple 208 (FIG. 4) which is located in a hole in gas feed inlet plate 128B (FIG. 10) in position to monitor the temperature just above afterheater element 170. The leads of thermocouple 208 are brought up by a ceramic tube 210 through header block 104 for connection to connector 207.

The heat-conductive structure comprising plates 118A and 118B is shaped to provide a controlled temperature gradient along the lengths of those plates. Thus, as indicated in FIG. 3, plates 118A and B do not have a uniform thickness along their lengths. Instead for a short distance extending up from their lower ends the broad outer surfaces 212 of plates 118A and B extend parallel to their straight inner surfaces, and thereafter as indicated at 212A the outer surfaces are slanted and converge at a fixed angle toward the inner surfaces.

Adjacent their upper ends the outer surfaces again extend parallel to the inner surfaces as shown at 212B. Due to this wedge-shaped configuration, grooves are provided in the outer surfaces 212 of plates 118A and B (as is believed clear from FIG. 3) to accommodate portions of gas pipes 150A and 150B.

Referring now to FIGS. 3–5, die 58 is made of graphite and comprises an upper capillary section 215 having a narrow horizontal capillary slot 216 extending for the full length of its upper end and a plurality of vertical capillary holes 218 which intersect slot 216. The lower end of the upper capillary section is sandwiched between two plates 220A and 220B which form a lower capillary 224. Plates 220A and B in turn are sandwiched between plates 90A and 90B. The upper and lower die sections are pinned together by two graphite pins 226 which extend through plates 90A and 90B as shown in FIGS. 4 and 5. Plates 90A and B preferably are cut back as shown at 228 out of engagement with the narrow side edges of the die assembly to reduce heat loss from those areas of the die.

In addition to the components already described, a heat insulating material 230 is packed into the housing around plates 118A and B to reduce heat loss. For convenience of illustration, only a portion of the insulation is shown in FIGS. 3, 4 and 11. Graphite felt may be used for the insulation.

Referring now to FIGS. 3, 4, 12 and 13, overlying the upper surface of header block 104 is a liminate consisting of two aluminum sheets 232 and 234 and an intermediate copper layer 236 made up of six discrete flat copper plates 238–243 which are insulated from the adjacent aluminum plates. This laminate is secured to the header block by screws 246. One end of each of the plates 238–243 projects beyond an end of header block 104 and forms a tab as shown at 248 which serves as a terminal for connection to a source of electrical power.

The upper ends of conductor rods 184A and B, 188, 192, 173A and B are reduced in diameter so as to form shoulders that engage the copper plates and are threaded to receive nuts 250 which hold them tight against those plates.

Still referring to FIGS. 12 and 13, header block 104 and the laminate overlying it are formed with elongate apertures 252 and 254 which are aligned with die 58 and are sized to permit withdrawal of the growing ribbon crystals. Although not shown, it is to be understood that the upper and lower plates 70 and 76 of each pulling mechanism have correspondingly shaped and aligned holes through which the ribbon is transported by operation of the puller.

Although not shown, it is to be understood that the several heating elements and the two thermocouples which have been described in connection with the illustrated apparatus are arranged to be connected into a power circuit provided with means for varying the power supply to each of the heating elements according to the desired operating parameters and the temperature sensed by the two thermocouples.

Operation and use of the apparatus described above is believed obvious to a person skilled in the art from the foregoing description. For convenience, the following description of such operation and use will deal with only one cartridge. Assuming that the crucible is filled with a melt, one of the several cartridges is lowered into place so that the lower end of its die is in contact with the molten feed material. The molten feed material rises to the top of the die. Thereafter, in the manner described in U.S. Pat. Nos. 3,591,348 and 3,607,112, a seed crystal is lowered by means of the pulling mechanism to make contact with the top of the die. The lower end of the seed crystal melts and connects with the molten material at the upper end of the die. Thereafter the crystal pulling belts of the pulling mechanism are driven to cause the seed crystal to be pulled upwardly at a selected rate. As the seed crystal is pulled upwardly, new crystalline material is continuously formed on the seed.

Figure 6:
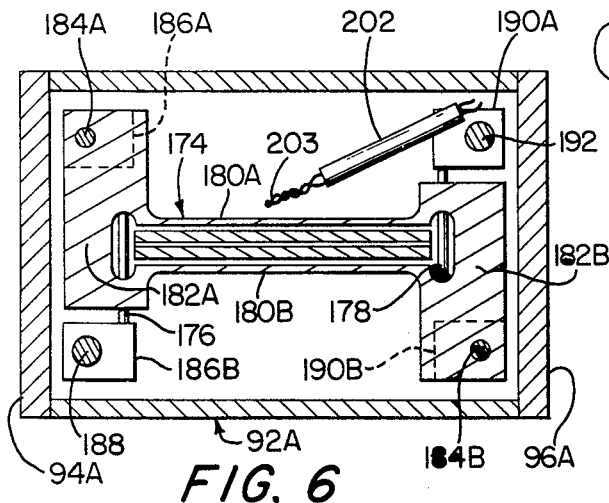
Figure 7:
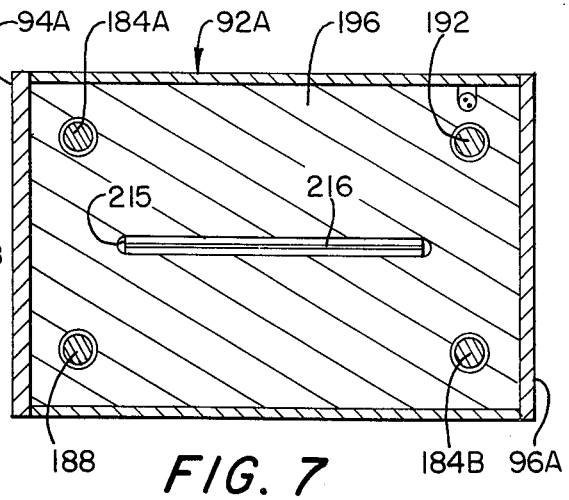

The apparatus described above makes it possible to grow substantially monocrystalline silicon ribbon of controlled size at optimum speeds and with precise control of the several growth parameters. The system also makes it possible to achieve multiple crystal growth from a single furnace at different pulling speeds, inasmuch as each cartridge is connected to its own pulling mechanism. The horizontal in-line design of the multiple cartridge arrangement shown in FIG. 1 has a number of features to recommend itself. First of all, the thermal environment along the furnace is complementary to that required for the growth interface at each die regardless of ribbon width. Secondly, there is substantial space available around each die and it is possible due to the arrangement of the cartridge and furnace, to observe each ribbon die from two sides. The use of multiple heaters as shown in FIGS. 3, 4 and 6 makes it possible to trim the thermal conditions of the individual dies more easily. The cooling zone provided by means 48 directly above the die makes it possible to rapidly remove the heat of fusion and this cooling zone coupled with cooling plates 118A and 118B, makes it possible to produce specific temperature profiles in the ribbon as it cools. This helps to prevent and eliminate residual stresses in the ribbon and also permits growth of crystalline bodies at a relatively high rate. By way of example, a system similar to that described above employing a two inch EFG ribbon die has been operated successfully in attaining the growth of two inch wide silicon ribbons at a pulling speed of two inches per minute without excessive residual stresses in the ribbon.

Other advantages are obtained from the particular construction of the cartridge units. As is evident from FIGS. 4 and 5, the bottom wall of the cartridge is held to the rest of the cartridge by means of pins 102 which allow it to be removed and replaced readily. This is advantageous as EFG dies may require frequent replacement. The die is easily removed from the bottom wall of the cartridge by removal of pins 226. The cartridge arrangement also allows for the use of heat shields as shown at 196 which thermally isolate the die heaters 174, 176 and 178 from the space above the die into which the newly-crystalized material is drawn. Obviously the number of heat shields also may be modified as required. The use of thermo-couples as described also allows precise control of the temperature at the upper end of the die where crystallization occurs as well as at the lower end of the cooling plates 118A and 118B. The latter in turn are shaped to provide a central opening of a shape that conforms closely to the cross-sectional shape and size of the crystal being produced. By virtue of the relatively large thickness and high thermal conductivity of cooling plates 118A and 118B, a uniform heat flow occurs along their length from near the die to the header block 104 which is cooled by liquid circulating in pipes 133, 135 and 139. The heating element 170 located at the bottom end of cooling plates 118A and 118B assists in controlling and modifying the temperature provided along the length of those plates. Essentially, the two cooling blocks direct heat lengthwise due to the fact that insulation 230 prevents radiative heat loss laterally of the crystal. A further advantage of the cartridge construction is provision of the tubes 150A and 150B for feeding gas to the channel 130 through which the crystal is pulled. This gas flow insures a clean environment for the newly-formed crystal and also enhances heat conduction in the narrow gap between the crystal and the surrounding structure of cooling plates 118A and 118B. Further advantages stem from the fact that the various electric and fluid connections are made to the growth system cartridge while the latter is removed from the furnace and, since the cartridges are removable from the furnace, component replacement can be carried out in a working area separate from the crystal growing area, thereby reducing the likelihood of contamination in the latter area.

Obviously, the apparatus described above may be modified without departing from the principles of this invention. Thus, for example, the cooling gas piping system could be changed so that the cooling gas is fed in through openings in cooling plate 148. Also mounting blocks 114A and B and/or pipes 142 A and B and/or pipes 143 A and B could be modified to permit raising and lowering of cooling plate 148 relative to the upper end of the capillary die. Still another possible modification is to use a die for growing a crystal body of different cross-sectional shape and to correspondingly change the shape of the inner surfaces of plates 118A and B. Thus, for example, the die may be designed to permit growth of cylindrical tubes, in which case the inner (and outer) longitudinal extending surfaces of plates 118A and B are made with a circular curvature to conform to the cross-sectional curvature of the grown crystal. Still other modifications will be obvious to persons skilled in the art.

What is claimed is:

1. Apparatus for growing a silicon ribbon-type crystal from a melt comprising:
    a furnace having (1) a chamber with a top aperture leading to the interior of said chamber, (2) means within said chamber for supporting therein a crucible containing a melt from which a crystal is to be grown so that the melt in the crucible will be in line with the aperture, and (3) means for heating a crucible supported within said chamber by said supporting means; and
    at least one cartridge which is arranged to be moved into and out of said furnace through said top aperture, said cartridge being a unitary assembly comprising (1) a capillary die adapted to be used to provide a growth pool of melt from which a crystal can be pulled, (2) solid vertically elongate heat-conducting means disposed above said die and arranged so as to extend on opposite sides of and control the thermal gradient lengthwise in a ribbon-type crystal which is pulled from said growth pool of melt and (3) means holding said heat-conducting means in a fixed relation to said die;
    means for moving the cartridge vertically into and out of said chamber via said aperture and for positioning the cartridge within said chamber so as to place said die in communicating relation with a melt contained by said crucible, said means for moving the cartridge including guide means for guiding said cartridge during its vertical movement into and out of said chamber; and
    a pulling mechanism disposed above the furnace for pulling a crystal from said growth pool of melt past said heat-conducting means and out of said furnace via said aperture.

2. Apparatus according to claim 1 wherein said guide means comprises at least one guide member affixed to and extending vertically from the upper side of said furnace and means slidably connecting said cartridge to said at least one guide member.

3. Apparatus according to claim 1 including a crucible in said furnace supported by said supporting means, and wherein said die comprises a capillary having an upper end and a lower end, and said means for moving said cartridge is adapted to lower said cartridge within said chamber so that the lower end of said capillary terminates within said crucible.

4. Apparatus according to claim 1 wherein said cartridge includes cooling means for producing a sharp thermal gradient between the upper end of said die and said heat-conducting means, said cooling means being located between and fixed with respect to said die and said heat-conducting means.

5. Apparatus according to claim 4 wherein said cooling means comprises a pair of mutually spaced sections disposed symmetrically with opposite sides of said die, and means for conductively cooling said mutually spaced sections.

6. Apparatus according to claim 5 wherein said cooling means comprises a pair of heat conductive elements, and means for circulating a cooling fluid through said heat conductive elements.

7. Apparatus according to claim 1 wherein said heat-conducting means comprises a pair of mutually opposed vertically elongate heat-conductive members which extend parallel to the pulling axis of the pulling mechanism and which are shaped so as to provide a controlled temperature gradient along the length of a crystal disposed between and extending lengthwise of said heat-conductive members.

8. Apparatus according to claim 7 wherein each of said heat-conductive members has a lower end and an upper end, and said cartridge further includes a local heating means for supplying heat to the lower ends of said heat-conductive members, said local heating means being fixed with respect to said die.

9. Apparatus according to claim 8 wherein said cartridge further includes a metal heat sink in conductive engagement with the upper ends of said heat-conductive members for removing heat from said heat-conductive members.

10. Apparatus according to claim 7 wherein said cartridge further includes insulating means surrounding said heat-conductive members for substantially the full length thereof so as to substantially completely prevent radiative loss of heat to the environment surrounding said members, and means for maintaining said insulating means in surrounding relation to said heat-conductive members.

11. Apparatus according to claim 7 wherein said heat-conductive members define a space through which a crystal may be pulled, said space being sized so that said heat-conductive members nearly touch said crystal.

12. Apparatus according to claim 11 wherein said cartridge further includes means for supplying a gaseous heat conductive medium in the space encompassed by said heat conductive members.

13. Apparatus according to claim 1 wherein said cartridge is attached to said pulling mechanism.

14. Apparatus according to claim 13 wherein said pulling mechanism and cartridge are movable as a unit toward and away from said furnace.

15. Apparatus according to claim 1 comprising at least two cartridges as defined by claim 1 and a corresponding number of said cartridge moving means for selectively and individually moving said cartridges into and out of said chamber.

16. Apparatus according to claim 14 comprising at least two cartridges movable into and out of said chamber and a like number of pulling mechanisms each attached to one of said cartridges, each pulling mechanism and the cartridge attached thereto being movable as a unit toward and away from said furnace.

17. A cartridge for use in growing a ribbon-type crystal from a melt contained in a furnace, said cartridge being a unitary assembly comprising:
a capillary die;
means for holding said die;
vertically elongate heat-conductive means located above said die for controlling the temperature gradient lengthwise of a ribbon-type crystal grown from a growth pool of melt at the upper end of said die;
a heat-conductive header;
means connecting said die holder and heat-conductive means to said header so that said heat-conductive means depends from said header and is fixed with respect to said die;
said heat conductive means being arranged to extend on opposite sides of said ribbon-type crystal above said die and defining a space extending from said die to said header through which a growing ribbon-type crystal may be pulled away from said die;
heat-insulating means positioned adjacent to said heat-conductive means for substantially the full length thereof for substantially preventing radiative loss of heat to the environment surrounding said cartridge; and
means attached to said cartridge whereby said cartridge may be guided for movement into and out of a melt-containing furnace.

18. A cartridge according to claim 17 further including a housing surrounding said heat-conductive means in a spaced relation thereto and means securing said housing to said header, with said heat-insulating means disposed between said housing and said heat-conductive means for reducing radiative heat loss from said heat-conductive means.

19. A cartridge according to claim 17 further including cooling means disposed between said capillary die and said heat-conductive means and fixed with respect to said die.

20. A cartridge according to claim 19 wherein said cooling means includes a cooling member located adjacent to the upper end of said capillary die, and means for circulating a cooling fluid through a portion of said cooling member.

21. A cartridge according to claim 17 further including electrical heater means disposed adjacent to said capillary die, electrical conductor means connected at one end to said heater means and at an opposite end to said heat-conductive header, and means for connecting said electrical conductor means to a source of electrical power.

22. A cartridge according to claim 21 further including a temperature sensor disposed adjacent to said capillary die, electrical terminal means supported by said header, and means connecting said temperature sensor to said electrical terminal means.

23. A cartridge according to claim 17 further including a housing surrounding said heat-conductive means, and further wherein said means for holding said die is attached to one end of said housing and the opposite end of said housing is attached to and depends from said header.

24. A cartridge according to claim 23 wherein the bottom end of said die projects below the bottom end of said housing and wherein said heat-conductive means comprises at least one heat-conductive member having an upper end and a lower end and being elongated in a direction running from said upper end to said lower end, said heat-conductive member at least partially defining said space, one end of said heat-conductive member and header being connected so that heat can flow from one said heat-conductive member to said header by conduction, and further including means located above said die for supplying heat to the opposite end of said heat-conductive member.

25. A cartridge according to claim 23 wherein said heat-conductive means comprises at least one heat-conductive member having an upper end and a lower end, said heat-conductive member being elongate in a direction running from said top end to said bottom end and at least partially defining said space, said upper end of said heat-conductive member and said header being connected so that heat can flow by conduction from said heat-conductive member to said header, and further including electrical heater means located above said die for supplying heat to the lower end of said heat-conductive member.

26. A cartridge according to claim 25 further including means carried by said header for introducing a gas into said space.

27. A cartridge according to claim 25 further including heat insulation means surrounding said heat-conductive means between said upper and lower ends for reducing radiative heat loss laterally from said heat-conductive means.

28. A cartridge according to claim 27 further including at least one additional electrical heater means for supplying heat to the upper end of said die, all of said heater means being supported by electrically conductive means attached to said header.

* * * * *